(12) United States Patent
Nichiporuk et al.

(10) Patent No.: US 9,571,033 B2
(45) Date of Patent: Feb. 14, 2017

(54) METHOD AND FACILITY FOR CONTROLLING THE INTERNAL PRESSURE OF A PHOTOVOLTAIC MODULE

(71) Applicants: "APOLLON SOLAR", Lyons (FR); COMMISSARIAT A L'ENERGIE ATOMIQUE ET AUX ENERGIES ALTERNATIVES, Paris (FR)

(72) Inventors: Oleksiy Nichiporuk, Mions (FR); Paul Lefillastre, Paris (FR); Julien Dupuis, Veneux les Sablons (FR)

(73) Assignees: "APOLLON SOLAR", Lyons (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 75 days.

(21) Appl. No.: 14/647,004

(22) PCT Filed: Nov. 21, 2013

(86) PCT No.: PCT/EP2013/074406
§ 371 (c)(1),
(2) Date: May 22, 2015

(87) PCT Pub. No.: WO2014/079945
PCT Pub. Date: May 30, 2014

(65) Prior Publication Data
US 2015/0303869 A1    Oct. 22, 2015

(30) Foreign Application Priority Data
Nov. 23, 2012    (FR) ...................................... 12 61186

(51) Int. Cl.
*H02S 50/10*    (2014.01)
*H01L 31/048*    (2014.01)
(Continued)

(52) U.S. Cl.
CPC ......... *H02S 50/10* (2014.12); *B32B 17/10036* (2013.01); *G01L 5/00* (2013.01);
(Continued)

(58) Field of Classification Search
None
See application file for complete search history.

(56) References Cited

U.S. PATENT DOCUMENTS 5,364,481 A * 11/1994 Sasaki .................. C23C 16/545
                                                       118/718
2008/0257401 A1    10/2008 Lauvray et al.

FOREIGN PATENT DOCUMENTS

DE    10 2008 009503 A1    8/2009
WO        03/038911 A1    5/2003
(Continued)

OTHER PUBLICATIONS

International Search Report, dated May 9, 2014, from corresponding PCT application.
(Continued)

*Primary Examiner* — Paresh Patel
(74) *Attorney, Agent, or Firm* — Young & Thompson

(57) ABSTRACT

A method for controlling the internal pressure of a photovoltaic module having a front plate, rear plate, photovoltaic cells, electrical interconnection conductors, and peripheral seal, in which the conductors are in pressure contact with the cells, under the effect of a force resulting from a vacuum prevailing inside the module. The method includes: a) gradually reducing the pressure of a gas quantity around the module; b) detecting, during step a), a physical parameter representative of the actual pressing of the interconnection conductors against the cells; and c) determining a value of the internal pressure of the module on the basis of a variation in the physical parameter. The control facility comprises an
(Continued)

Figure 1:
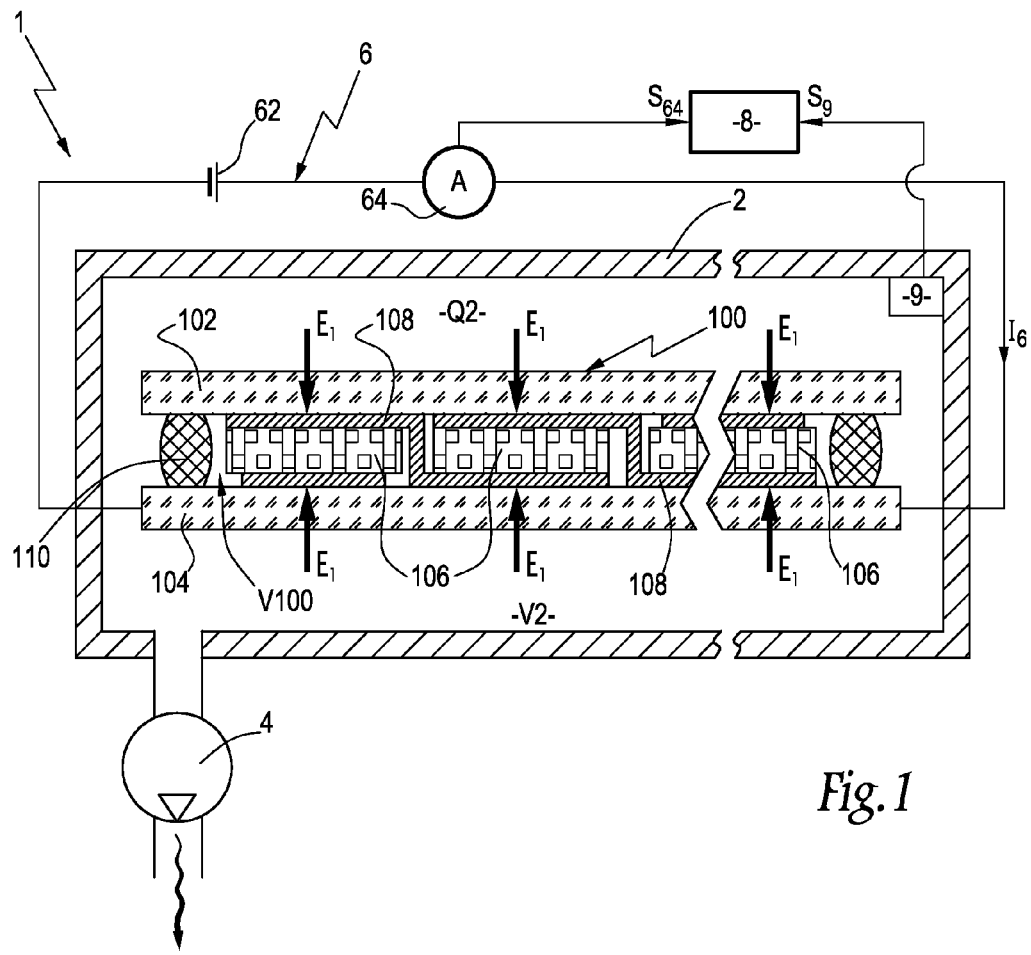

enclosure for receiving the module inside a gas quantity, the enclosure including elements for: reducing the pressure of this gas quantity, detecting a physical parameter representative of the actual pressing, and determining the internal pressure of the module.

12 Claims, 1 Drawing Sheet

(51) Int. Cl.
    *G01R 31/40*     (2014.01)
    *H01L 31/05*     (2014.01)
    *G01L 5/00*     (2006.01)
    *B32B 17/10*     (2006.01)
    *H01L 21/66*     (2006.01)

(52) U.S. Cl.
    CPC ........ *H01L 31/048* (2013.01); *H01L 31/0504* (2013.01); *H02S 50/00* (2013.01); *H01L 22/14* (2013.01); *Y02E 10/50* (2013.01)

(56) References Cited

FOREIGN PATENT DOCUMENTS

WO     2004/095586 A2     11/2004
WO     2012/072792 A1     6/2012

OTHER PUBLICATIONS

FR Search Report, dated Sep. 6, 2013, from corresponding FR application.

* cited by examiner

METHOD AND FACILITY FOR CONTROLLING THE INTERNAL PRESSURE OF A PHOTOVOLTAIC MODULE The invention relates to a method for controlling the internal pressure of a photovoltaic module of the type comprising an internal volume having a negative pressure relative to the ambient atmospheric pressure and in which an electrical contact between the photovoltaic cells and the electrical interconnection conductors is brought about only by means of pressure, as envisaged in the documents WO-A-03/038 911, WO-A-2004/095 586 or WO-A-2012/072 792.

During the manufacture of photovoltaic modules of this type, it is important to ensure that the electrical connections between the cells and the electrical interconnection conductors are established in a manner so as to be reliable and lasting. This is the reason why, a technique known from the documents WO-A-03/038 911 and WO-A-2004/095 586 is to use a peripheral seal which ensures the sealing between the internal volume of the module and the external atmosphere. In practice, the difference in pressure between the internal volume of the module and the ambient atmosphere creates a force that enables the contact through pressure between the interconnection conductors and the photovoltaic cells.

The value of the negative pressure prevailing within the photovoltaic module is thus an important parameter for such a module. For the purposes of the present invention, the notion of negative pressure is a relative notion and corresponds to an absolute pressure that is lower than that of the environment of the module.

In order to establish the negative pressure that is to prevail within a photovoltaic module of the aforementioned type, it is necessary to take into account the operating temperature range of such a module, typically between −40° C. and +90° C. An insufficient negative pressure in the module relative to the ambient pressure, limits, or even eliminates, the force of the pressure contact between the interconnection conductors and the cells, which can lead to the loss of electrical contact when the temperature of the module is high, on account of the expansion of the gas present in the module which results in an increase in its internal pressure. Conversely, an extremely intense negative pressure induces a very considerable pressure contact force along with a risk of breaking of the photovoltaic cells when the temperature of the module is low.

In addition, the internal pressure of the module should be appropriately adjusted based on the place of operation or use thereof, in particular if the module is to be installed at high altitude where the external pressure is relatively low, this being in order to retain a same given range of differences in pressure between the interior and the exterior of the module, so as to avoid the problems mentioned here above.

The creation of a negative pressure in the module takes place during the fabrication of the latter in line. It is a known practice to produce such a negative pressure, when all of the internal components of the module have been set in place between the front plate and the rear plate thereof, by placing the assembly in a press, which itself is contained in a bell jar vacuum chamber. The bell jar vacuum chamber is brought to negative pressure, to a pressure corresponding to a set point value. When the pressure within the interior of the bell jar reaches the set point value, the module is pressed, in order for a peripheral seal to be able to ensure that the module is tightly sealed against air and water. The bell jar is then returned to atmospheric pressure and the module is released.

During this step of pressing, it is essential to ensure that the value of the negative pressure actually created in the module is in conformity with the set point value. This actual value of the negative pressure depends mainly on the set point pressure, the temperature within the interior of the bell jar vacuum chamber and the intensity of the pressing force module. Even if these parameters are a priori relatively easy to check and control, it turns out that the sensors used are never completely reliable and that the inhomogeneities in temperature within the bell jar vacuum chamber, in the press or in the environment of the production line for the module, may add some uncertainty as to the real negative pressure within the interior of the module. It is therefore important to have available a checking-control means for directly checking and controlling the internal pressure of the module during the course of its production, in order to perform a checking-control operation.

For this purpose, it is a known practice to measure the internal pressure of a photovoltaic module by means of using a pressure sensor inserted within the interior of the module and communicating with the exterior by way of RFID (radio frequency identification). This solution calls for introducing an additional element into the module, which poses a potential problem of degassing of the sensor, over the course of time. This degassing may induce an increase in pressure and cause the reliability of the module to be compromised. Furthermore, the aesthetics of the module gets modified due to the incorporation of the sensor, which poses a problem in terms of the marketing thereof. In addition, as the internal thickness of the module, that is to say the distance between the opposite facing surfaces of the front plate and the rear plate thereof, is low, generally of the order of 1 mm, it is necessary to make use of a sensor that is thin, and therefore specific and thus involving a relatively high cost price. By way of a variant, it is possible to use a thicker sensor, by providing for hollow recesses in the opposite facing surfaces of the front and rear plates of the module. Whereas this solution makes it possible to use a more conventional sensor, and therefore one that is economical, it imposes the need to modify the plates, which are for example made of glass. This is not easy and requires the use of specific types of glass, hence making it impossible to test other glass types. In addition, the implementation of these hollow recesses locally weakens the front plate or the rear plate.

It is these drawbacks that the invention more particularly aims to remedy by providing a novel control method for checking and controlling the internal pressure of a photovoltaic module which does not require the use of a sensor and which provides the ability to determine, with an acceptable degree of precision, the internal pressure of a module, which results in a good degree of predictability of the contact force between the electrical interconnection conductors and the cells with which they are associated.

To this end, the invention relates to a control method for checking and controlling the internal pressure of a photovoltaic module comprising a front plate, a rear plate, photovoltaic cells, conductors for electrical interconnection between the cells, and a peripheral seal, in which the conductors are in pressure contact with the cells, under the effect of a force resulting from a negative pressure prevailing within the interior of the module. According to the invention, this method includes the following steps consisting of:
 a) gradually causing the progressive reducing of the pressure of a quantity of gas around the module;

b) detecting, during the step a), a physical parameter representative of the actual pressing of the interconnection conductors against the cells;

c) determining a value of the internal pressure of the module as a function of a variation in the physical parameter.

Thanks to the invention, the detection of the internal pressure of the module is carried out in an indirect fashion, without having to use a sensor incorporated into the module, by considering that the internal pressure of the module is equal to the pressure of the quantity of gas present around the module, when a variation in the physical parameter is detected.

According to advantageous but non mandatory aspects of the invention, such a method may incorporate one or more of the following characteristic features, taken into consideration in accordance with any technically feasible combination:

The step a) is carried out by placing the module in a controlled pressure enclosure and by gradually causing the progressive reducing of the pressure within the interior of this enclosure, from the atmospheric pressure.

The value of the pressure determined during the step c) corresponds to the pressure for which the physical parameter varies due to the easing of the pressure contact force, between at least one interconnection conductor and one photovoltaic cell.

The parameter detected during the step b) is an impedance of the module, whereas during the step b), an electric current is injected into the module and a variation in a component of this current is detected.

The current injected during the step b) is at a constant voltage and the component detected is the intensity of the current.

The current injected during the step b) is at a constant intensity and the component detected is the voltage at the terminals of the module.

The parameter detected during the step b) is a geometric parameter of the front plate and/or the rear plate of the module.

The parameter detected during the step b) is representative of the planarity of the front plate or the rear plate.

During the step b), the parameter is detected by optical means, in particular by displacement of at least one light beam that is reflected or deflected by the front plate or the rear plate.

During the step c), the internal pressure of the module is considered to be equal to the pressure of the quantity of gas around the module when the value of the physical parameter detected varies by a predetermined percentage relative to its original value, this percentage being comprised between 1% and 5%, preferably equal to 2%.

Moreover, the invention relates to a facility that makes it possible to operationally implement a method as mentioned here above and more specifically, a control facility for checking and controlling the internal pressure of a photovoltaic module, this module comprising a front plate, a rear plate, photovoltaic cells, the electrical interconnection conductors for interconnection between the cells, as well as a peripheral seal, with the conductors being in pressure contact with the cells, under the effect of a force resulting from a negative pressure prevailing within the interior of the module. According to the invention, this control facility includes:

a module receiving enclosure, for receiving the module within a quantity of gas, the said enclosure being provided with the means for causing the reducing of the pressure of this quantity of gas;

parameter detection means, for detecting, during the decreasing of the pressure of the quantity of gas, a physical parameter representative of the actual pressing of the interconnection conductors on the cells; and pressure determination means, for determining the internal pressure of the module, on the basis of an output signal from the detection means.

Figure 2:
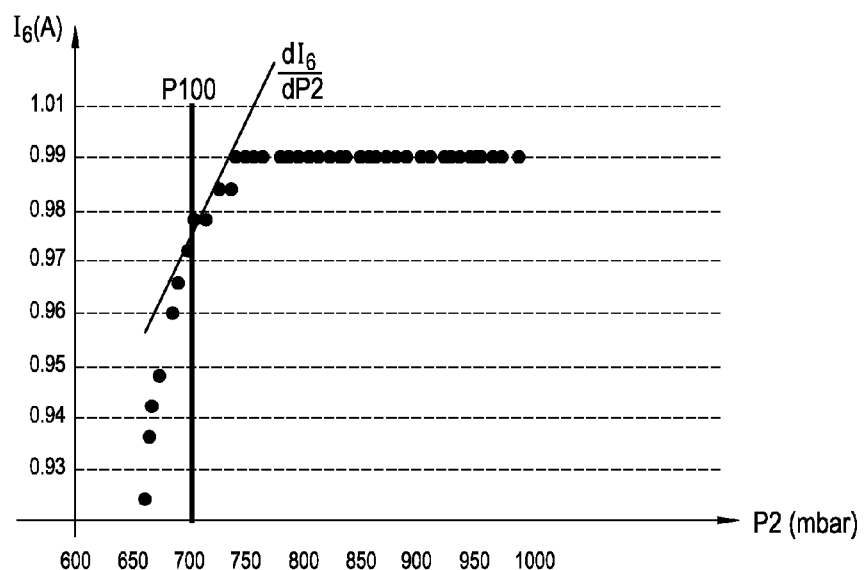

The invention will be better understood and other advantages thereof will become more clearly apparent in light of the description that follows of several embodiments of a method and a facility in accordance with the principle thereof, given by way of example only and with reference being made to the accompanying drawings in which:

FIG. 1 is a schematic representation in principle of a facility according to a first embodiment of the invention FIG. 2 is a schematic representation in principle related to the evolution of the current detected by the ammeter of the facility shown in FIG. 1, as a function of the pressure of a gas present around the module received in this facility;

The facility 1 represented in FIG. 1 is intended to receive a photovoltaic module 100 that includes a translucent front plate 102, for example made of glass, intended to be turned towards the sun in the operational configuration. The module 100 also includes a rear plate 104 which may be made out of glass or another transparent or opaque material. The module 100 also includes a plurality of photovoltaic cells 106, produced out of silicon based material and connected with each other by means of interconnecting strips 108, which are themselves made from an electrically conductive material such as copper. These strips 108 electrically interconnect the cells 106 with each other, within the internal volume V100 of the module 100. The strips 108 are arranged to simply bear against the terminals of the cells 106 that are not represented.

The module 100 also includes a peripheral seal 110 which isolates the volume V100 from the exterior and is arranged along the edges of the plates 102 and 104.

The electrical connection between the cells 106 and the strips 108 is brought about with the aid of a pressing force $E_1$ exerted by the plates 102 and 104 and which pushes the strips 108 against the terminals of the cell 106. This force $E_1$ is the resultant of the difference in pressure between the ambient atmosphere surrounding the module 100 and the pressure P100 of air or gas present in the volume V100. Over the course of use of the module 100, the pressure of the ambient atmosphere may be considered to be equal or substantially equal to 1000 millibars.

In order for the pressing force $E_1$ to be sufficiently intense so as to ensure an effective electrical connection between the cells 106 and the strips 108, it is important for the difference in pressure between the ambient atmosphere and the volume V100 to be significant, without however being too great.

This difference in pressure is obtained by the manufacturing, under partial vacuum, of the module 100, within a press disposed within the interior of a bell jar, as explained here above.

When the module 100 has been manufactured, it can be checked and controlled to determine the effective pressure P100 prevailing within the volume 100. This checking and control operation is carried out on certain modules of a production batch, for example on one module per one hundred.

This checking and control is carried out by operationally implementing a method according to which the module 100 is introduced into an enclosure 2 which is closed, for which the internal volume is denoted as V2. This volume V2 contains a quantity Q2 of nitrogen distributed around the module 100. The enclosure 2 is connected to a vacuum pump 4 which is capable of gradually progressively purging the enclosure 2, which has the effect of causing the reducing of the pressure of the quantity of nitrogen Q2.

The reference P2 denotes the pressure of the quantity of nitrogen Q2 surrounding the module 100 within the volume V2 of the enclosure 2.

By way of an example, it is assumed that the nominal value of the pressure P100 is 700 millibars.

When the module 100 is introduced into the enclosure 2, the pressure P2 is equal to the atmospheric pressure, here considered to be 1000 millibars. The start of operation of the pump 4 makes it possible to decrease the pressure P2 progressively.

The facility 1 also includes a measuring circuit 6 which is connected to two terminals of the module 100 normally used for connecting it to an electrical power transmission system for conveying the electricity generated by the cells 106. These terminals are not represented in FIG. 1 for the sake of maintaining clarity in the drawing. This circuit 6 comprises a voltage generator 62 connected to the two terminals of the module 100, with the interposition of an ammeter 64 which also belongs to the circuit 6. Thus, the generator 62 supplies an electric current of constant voltage to the module 100, with the intensity $I_6$ of this electric current being measured by the ammeter 64. It is considered that the generator 62 is set at the origin so as to deliver to the module 100 a current of intensity equal to 1 Amp when the module is operating normally.

The facility 1 also comprises an electronic unit 8 to which is supplied the output signal $S_{64}$ from the ammeter 64.

The facility 1 also comprises a pressure sensor 9 disposed within the interior of the volume V2 of the enclosure 2 and which provides the ability to detect the pressure P2. This pressure sensor 9 delivers to the unit 8 an electronic signal $S_9$ representative of the pressure P2.

The circuit 6 provides the ability to detect a variation in the impedance of the module 100, this variation in impedance resulting from a change in the distribution of the forces in this module, that is to say from a decrease in the intensity of the force $E_1$.

In fact, during operation of the pump 4, the pressure P2 gradually decreases. When the pressure P2 reaches 700 millibars, the pressure P2 and P100 on both sides of the plates 102 and 104 are equal, in a manner such that the pressing force $E_1$ is zero or almost zero and at least one of the interconnection strips 108 is no longer compressed against the adjacent cell 106 but is simply "posed" over the latter, or is even slightly offset, due to the resilient recovery of form of the front and rear plates 102 and 104 following the removal of the deformation thereof by means of the pressure differential.

Under these conditions, the impedance Z100 of the module 100, as perceived by the circuit 6 increases. As the generator 62 supplies a constant voltage, the current intensity $I_6$ is a variable value representative of the impedance E100. When the impedance Z100 increases, the intensity $I_6$ decreases, which is detected by the ammeter 64 that then sends to the unit 8 the corresponding signal $S_{64}$.

Thus, the impedance Z100 constitutes a parameter that represents the actual pressing of the strips 108 against the cells 106. Moreover, the intensity $I_6$ also constitutes a parameter that is representative of this pressing, since the voltage supplied by the generator 62 is constant.

As is shown in FIG. 2, when the pressure P2 decreases progressively from 1000 millibars to 600 millibars, the value of the intensity $I_6$ remains constant up to about 750 millibars, the value from which the intensity $I_6$ decreases quite significantly, which is accordingly detected by the unit 8, on the basis of the signals $S_9$ and $S_{64}$.

An effective calibration of the unit 8 makes it possible to consider that the pressure P2 and P100 are substantially equal when the intensity $I_6$ of the current decreases by 2% from its nominal value, that is to say 1 Amp in the example. In practice, the percentage N % of the intensity $I_6$ set so as to consider that a variation of this intensity corresponds to the equality of pressures P2 and P100 is chosen to be between 1% and 5%, with the value of 2% being preferred. The calibration of the unit 8 based on the percentage of decrease in the intensity $I_6$ of the current depends on the type of module used, in particular on the rigidity of the front and rear plates that do not behave in an identical manner when the pressure differential becomes zero. The current decreases more slowly in the case of rigid plates than in the case of flexible plates.

By way of a variant, the unit 8 can take into account the slope $dI_6/dP2$ of the curve that is representative of the value of the intensity $I_6$ as a function of the pressure P2, that is to say the speed with which the intensity $I_6$ decreases. When the absolute value of this slope $dI_6/dP2$ exceeds a predetermined threshold value, the unit 8 is able to consider the pressure values P2 and P100 as being equal. This slope may also be calibrated on the basis of the mechanical characteristics of the plates 102 and 104.

When the value of the pressure P100 has thus been determined, the operation of the pump 4 may be interrupted and the enclosure 2 may be opened. P2 pressure thus then increases until about 1000 mb and the force E1 effortlessly returns to its normal value, which again causes the strips 108 to press flat on the cells 106. The module 100 is then extracted and it can be used normally since the checking and control carried out does not have any consequent effects on the structure or operation thereof.

The invention takes advantage of a threshold effect observed when the pressures on both sides of the plates 102 and 104 are balanced. This threshold effect comes about mainly due to the fact that the strips 108 are simply pressed on to the cells 106, without being welded or glued to the latter, and that this pressing is normally sufficient to ensure optimal electrical contact, under the effect of the force $E_1$ resulting from the difference in pressure between the pressure P100 and the pressure P2 of the nitrogen around the module 100. The control method of the invention is tantamount to temporarily cancelling out this difference in pressure so as to remove or degrade the electrical contact between the strips 108 and the cells 106, which makes it possible to easily detect the pressure at which this phenomenon is brought about.

It may be understood that, taking into consideration the very marked nature of the decrease in intensity $I_6$ when the pressures P2 and P100 are equalised, the uncertainty with respect to the determination of the pressure P100 is low.

The method of the invention can be operationally implemented in a production facility for manufacturing photovoltaic modules, in a manner such that it provides the ability to respond promptly without delay in the event of drift in the pressure from the modules in the course of being manufactured. Indeed, by taking samples of some modules from a batch of modules in the course of being manufactured, it is possible to react to a modification in operating conditions of the press, such as variations in temperature or external pressure that could have a negative impact on the precision with which the negative pressure is brought about within the modules that are in the process of being manufactured.

According to one variant of the invention, the generator 62 of the circuit 6 may be a current generator, in which case it is the voltage $V_6$ at the terminals of the module 100 that may be measured by making use of a voltmeter. A variation in this voltage can be taken into account by the unit 8 in order to detect when the pressure P2 becomes equal to the pressure P100.

According to another variant embodiment, use may be made of a combination of voltage/intensity values of a current for detecting the obtaining of a pressure P2 equal to the pressure of the module 100.

The invention described here above is as in the event where the quantity Q2 is a quantity of nitrogen. By way of a variant, it may involve another gas.

According to another variant embodiment of the invention, the detection of the equalisation of the pressures P2 and P100 may be brought about by measuring the mechanical deformation of either one of the plates 102 and 104, or even of both the plates. In fact, these plates have a tendency to bend slightly when the difference in pressure between the pressures P2 and P100 is significant, and then to resume a planar configuration when these pressures get balanced out. This geometric variation of the plates 102 and 104 can be detected by an optical method, for example by measuring the displacement of a laser spot reflected by one of the outer surfaces of the module 100, that is to say one of the external surfaces of one of the plates 102 or 104.

In this case, the facility 1 is modified so as to incorporate a laser source that directs a beam on to one of the plates 102 and 104, this beam being deflected or reflected by one of these plaques in a way that changes according to variations in the actual geometry of this plate. Thus, a spot of the reflected or deflected beam gets displaced based on the geometry of either one of the plates 102 and 104 or of both of these plates, which may be detected by an observer or by means of a camera whose output signal is supplied to the unit 8.

The set point value of 700 millibars for the pressure P100 mentioned here above may be modified and take all the values between 0 and 850 mbar.

The technical characteristic features of the embodiments and variants envisaged here above may be combined with each other.

The invention claimed is:

1. A control method for checking and controlling the internal pressure of a photovoltaic module comprising a front plate, a rear plate, photovoltaic cells, conductors for electrical interconnection between the cells, and a peripheral seal, with the conductors being in pressure contact with the cells, under the effect of a force resulting from a negative pressure prevailing within the interior of the module, wherein the method includes the following steps consisting of:
   a) gradually causing the progressive reducing of the pressure of a quantity of gas around the module;
   b) detecting, during the step a), a physical parameter representative of the actual pressing of the interconnection conductors against the cells;
   c) determining a value of the internal pressure of the module as a function of a variation in the physical parameter.

2. The method according to claim 1, wherein the step a) is carried out by placing the module in a controlled pressure enclosure and by gradually causing the progressive reducing of the pressure within the interior of this enclosure, from the atmospheric pressure.

3. The method according to claim 1, wherein the value of the pressure determined during the step c) corresponds to the pressure for which the physical parameter varies due to the easing of the pressure contact force, between at least one interconnection conductor and one photovoltaic cell.

4. The method according to claim 1, wherein the parameter detected during the step b) is an impedance of the module and wherein, during the step b), an electricity current is injected into the module and a variation in a component of this current is detected.

5. The method according to claim 4, wherein the current injected during the step b) is at a constant voltage and the component detected is the intensity of the current.

6. The method according to claim 4, wherein the current injected during the step b) is at a constant intensity and the component detected is the voltage at the terminals of the module.

7. The method according to claim 1, wherein the parameter detected during the step b) is a geometric parameter of the front plate and/or the rear plate of the module.

8. The method according to claim 7, wherein the parameter detected during the step b) is representative of the planarity of the front plate or the rear plate.

9. The method according to claim 7, wherein during the step b), the parameter is detected by optical means, in particular by displacement of at least one light beam that is reflected or deflected by the front plate or the rear plate.

10. The method according to claim 1, wherein during the step c), the internal pressure of the module is considered to be equal to the pressure of the quantity of gas around the module when the value of the physical parameter detected varies by a predetermined percentage relative to its original value, this percentage being comprised between 1% and 5%, preferably equal to 2%.

11. The method according to claim 1, wherein during the step c), the internal pressure of the module is considered to be equal to the pressure of the quantity of gas around the module when the value of the physical parameter detected varies by a predetermined percentage relative to its original value, this percentage being equal to 2%.

12. A control facility for checking and controlling the internal pressure of a photovoltaic module, this module comprising a front plate; a rear plate, photovoltaic cells, the electrical interconnection conductors for interconnection between the cells, and a peripheral seal, with the conductors being in pressure contact with the cells, under the effect of a force resulting from a negative pressure prevailing within the interior of the module, characterised in that this control facility includes:
   a module receiving enclosure, for receiving the module within a quantity of gas, the said enclosure being provided with the means for causing the reducing of the pressure of this quantity of gas;
   parameter detection means, for detecting a physical parameter representative of the actual pressing of the interconnection conductors on the cells; and
   pressure determination means, for determining the internal pressure of the module, on the basis of an output signal from the detection means.

* * * * *